(12) United States Patent
Hieda et al.

(10) Patent No.: US 7,471,174 B2
(45) Date of Patent: Dec. 30, 2008

(54) CONNECTION STRUCTURE FOR COAXIAL CONNECTOR AND MULTILAYER SUBSTRATE

(75) Inventors: Haruhiko Hieda, Tokyo (JP); Hideki Asao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 286 days.

(21) Appl. No.: 10/537,416

(22) PCT Filed: Mar. 12, 2004

(86) PCT No.: PCT/JP2004/003297

§ 371 (c)(1),
(2), (4) Date: Jun. 2, 2005

(87) PCT Pub. No.: WO2004/082080

PCT Pub. Date: Sep. 23, 2004

(65) Prior Publication Data

US 2006/0049491 A1    Mar. 9, 2006

(30) Foreign Application Priority Data

Mar. 13, 2003    (JP)    .............................. 2003-068205

(51) Int. Cl.
*H01P 5/02*    (2006.01)

(52) U.S. Cl. ......................................... 333/246; 333/33
(58) Field of Classification Search ................. 333/246, 333/33, 260
See application file for complete search history.

(56) References Cited

U.S. PATENT DOCUMENTS 6,734,755 B2 *    5/2004    Cites et al. ..................... 333/33

FOREIGN PATENT DOCUMENTS

| JP | 64-005102 | 1/1989 |
| JP | 09-139260 | 5/1997 |
| JP | 09-199912 | 7/1997 |
| JP | 2000-241780 | 9/2000 |
| JP | 2001-177311 | 6/2001 |
| JP | 2002-198129 | 7/2002 |
| JP | 2003-068906 | 3/2003 |
| JP | 2003-233043 | 8/2003 |

* cited by examiner

*Primary Examiner*—Stephen E. Jones
(74) *Attorney, Agent, or Firm*—Oblon, Spivak, McClelland, Maier & Neustadt, P.C.

(57) ABSTRACT

In the structure for connecting a board and a coaxial connector, which electrically connects a high-frequency board 20 mounted in an electroconductive casing 1 and a coaxial connector 10, a transfer board 30 is disposed between the high-frequency board 20 and the coaxial connector 10, and the high-frequency board 20 and the coaxial connector 10 are electrically connected through the transfer board 30.

8 Claims, 6 Drawing Sheets

# CONNECTION STRUCTURE FOR COAXIAL CONNECTOR AND MULTILAYER SUBSTRATE

TECHNICAL FIELD

The present invention relates to a connection structure between a coaxial connector and a multilayer board for use in, for example, a high-frequency circuit of a communication device and so on.

BACKGROUND ART

In a conventional connection structure between a coaxial connector and a multilayer board, the signal line pattern of the transmission line (hereinafter, referred to as 'electroconductive pattern') of a high-frequency multilayer board (hereinafter, referred to as 'multilayer board') mounted in an electroconductive casing and the core wire of a coaxial connector have been directly electrically connected by use of suitable brazing material (see, for instance, JP-A-2001-177311).

The operation will now be described as below.

A high frequency signal input from the coaxial connector passes the connection between the coaxial connector and the multilayer board, and propagates through the transmission line formed on the multilayer board; and also in the propagating line in the direction opposite thereto, a high frequency signal that has propagated through the transmission line passes the connection between the coaxial connector and the multilayer board, and propagates toward the coaxial connector.

In the above operation, in the connecting portion between the coaxial connector and the multilayer board, the spacing between the grounding face on the casing and the core wire of the coaxial connector becomes large because the multilayer board has its thickness, to thereby cause the impedance of the transmission line in this area to be greatly disordered, and induce the transmission line to be dielectric. Here, there is a trend toward larger degree of the dielectric property thereof with increasing thickness of the multilayer board. In addition, in the multilayer board, because it is difficult to form the transmission line pattern in the uppermost layer of this board and the ground pattern in the layer located immediately under the layer closely to the end face of the board, a large pattern margin forms between the end face of the board and the end of the ground pattern. For this reason, in the vicinity of the end face of the multilayer board, it is impossible to form the ground pattern constituting the transmission line. Therefore, there arises a problem that the impedance of the transmission line is greatly disordered also in this area to thereby induce the transmission line to be dielectric.

On this account, in the conventional connection structure between the coaxial connector and the multilayer board, it is arranged that the coaxial connector is equipped with a capacitive coaxial line in order to cancel the above-mentioned dielectric property of the transmission line, and thereby an impedance match is schemed to ensure its performance capabilities.

The conventional connection structure between the coaxial connector and the multilayer board has been arranged as mentioned above. As a result, around the frequencies designed such that the impedance match is provided, the capacitive coaxial line provided on the coaxial connector and the dielectric transmission line provided in the connection between the coaxial connector and the multilayer board mutually cancel the capacitive property and the dielectric property to thus render the matching. This reduces the disorder of impedance, thereby enabling the obtainment of a certain level of return-loss characteristic. However, at frequencies away from the designed frequencies, the match cannot be provided, and the disorder of impedance in the connection between the coaxial connector and the multilayer board increases, thereby making it impossible to obtain the low return-loss characteristic indispensable to the high-frequency circuit. From these factors, in the conventional connection structure between the coaxial connector and the multilayer board, it is very difficult to obtain favorable return-loss characteristics over a wide frequency band. As a result, there is a problem that countermeasures to development of broadband in communication equipments seen in recent years cannot be implemented.

The present invention has been accomplished to solve the above-mentioned problem. An object of the present invention is to provide a connection structure between a coaxial connector and a multilayer board that can greatly reduce the disorder of impedance due to the electrical connecting portion between the coaxial connector and the board, and that can obtain an excellent return-loss characteristic over a broad band.

DISCLOSURE OF THE INVENTION

According to one aspect of the present invention, there is provided a connection structure between a coaxial connector and a multilayer board, the connection structure including: a casing; a coaxial connector that is provided in this casing, and has a core wire; a multilayer board that is provided in the casing, and has a first signal line pattern; a transfer board that is provided in the casing located between this multilayer board and the coaxial connector, has a second signal line pattern, and that is formed so that the thickness of the transfer board is smaller than the thickness of the multilayer board; a connecting means for electrically connecting the core wire of the coaxial connector and the second signal line pattern; and a transmission line that electrically connects the first signal line pattern to the second signal line pattern, and suppresses an electromagnetic field distribution in an inward direction of the multilayer board.

According to another aspect of the present invention, there is provided a connection structure between a coaxial connector and a multilayer board comprising: a casing in which an upper floor, a lower floor, and a sidewall, which is adjacent to the upper floor, are formed; a coaxial connector that is provided on the sidewall, and has a core wire; a multilayer board that is provided on the lower floor, and has a first signal line pattern; a transfer board that is provided on the upper floor, and has a second signal line pattern; a connecting means for electrically connecting the core wire of the coaxial connector and the second signal line pattern; and a transmission line that electrically connects the first signal line pattern to the second signal line pattern, and suppresses an electromagnetic field distribution in an inward direction of the multilayer board.

According to still another aspect of the present invention, there is provided a connection structure between a coaxial connector and a multilayer board, wherein the transmission line is a coplanar-type transmission line.

According to still another aspect of the present invention, there is provided a connection structure between a coaxial connector and a multilayer board, wherein the multilayer board that has the first signal line pattern includes a microstripline-type transmission line or a coplanar-type transmission line.

According to still another aspect of the present invention, there is provided a connection structure between a coaxial connector and a multilayer board, wherein the transfer board has a second backside ground pattern, and this second backside ground pattern and the second signal line pattern are electrically connected by use of a via hole formed on the side of the multilayer board.

Thereby, it is arranged that the transfer board, which electrically connects the high-frequency board mounted in the electroconductive casing and the coaxial connector, be disposed between the board and the connector. This eliminates the need for mounting a control-system circuit on the transfer board. Therefore, a single-layer-double-sided board can be used as the transfer board, thereby enabling the extreme reduction of the thickness of the transfer board. As compared to the conventional connection structure in which the multilayer board and the coaxial connector are directly electrically connected, it is possible to place the signal line pattern of the transfer board and the core wire of the coaxial connector extremely closely to the grounding face. As a result, the disorder of impedance in the transmission line can be greatly improved, to thereby ensure an excellent return-loss characteristic in a broad band.

BEST MODE FOR CARRYING OUT THE INVENTION

An embodiment of the present invention will now be described with reference to the drawings in order to make description in further detail of the present invention.

Embodiment 1

Figure 1:
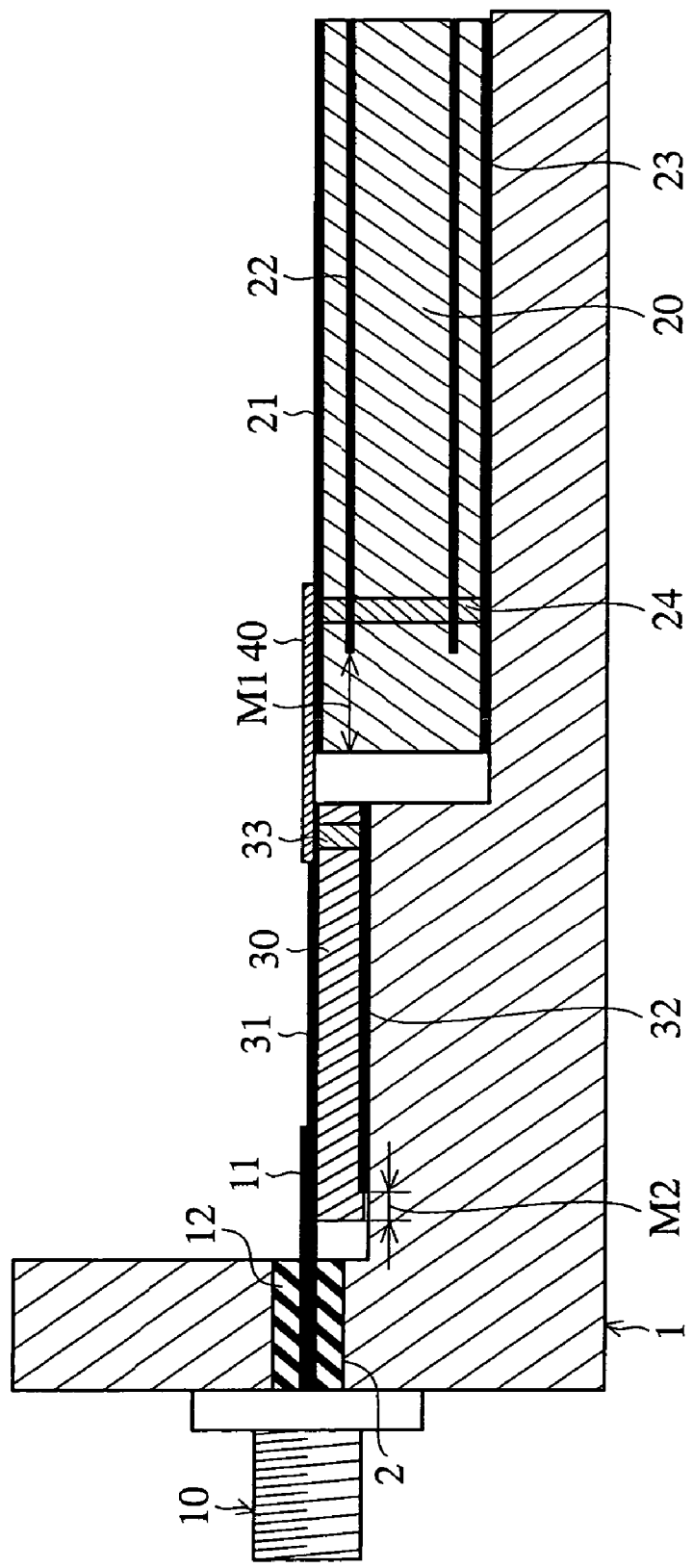
FIG. 1 is a longitudinal sectional side view of a connection structure between a coaxial connector and a multilayer board in accordance with a first embodiment of the present invention.
Figure 2:
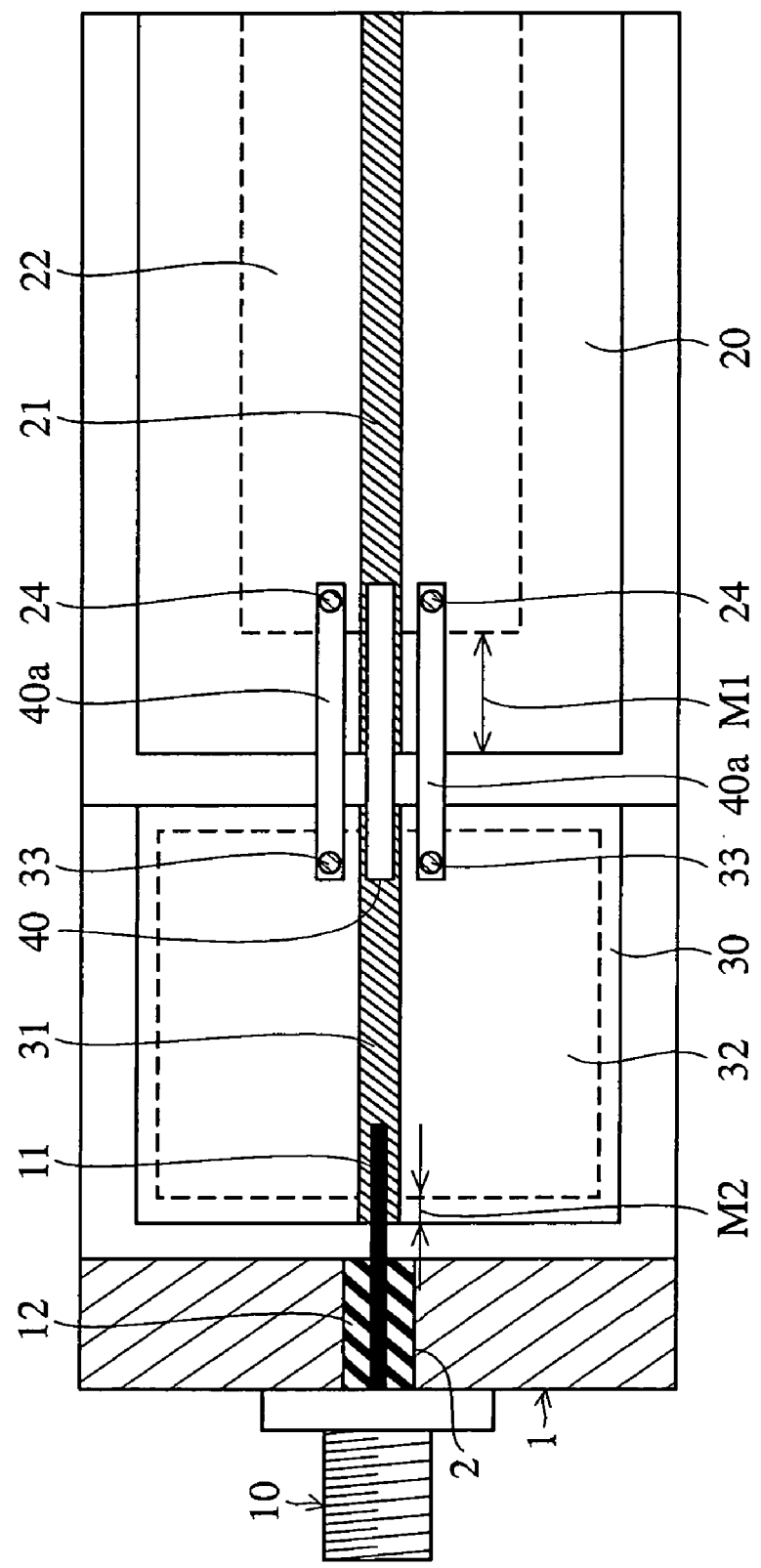
FIG. 2 is a partially cutout plan view of FIG. 1.

FIG. 1 is a longitudinal sectional side view of a connection structure between a coaxial connector and a multilayer board in accordance with a first embodiment of the present invention, and FIG. 2 is a partially cutout plan view of FIG. 1.

As shown in FIG. 1 and FIG. 2, a coaxial connector 10 and a multilayer board (high-frequency board) 20 are mounted on an electroconductive casing 1, and a transfer or intermediate board 30 electrically connecting the both is disposed between the coaxial connector 10 and the multilayer board 20.

To explain in further detail, a connector-mounting hole 2 is prepared at the sidewall of the casing 1, and the core wire 11 of the coaxial connector 10 is inserted into this connector-mounting hole 2 through an insulator 12. Moreover, the transfer board 30 is mounted on the inner wall of the casing 1. The transfer board 30 is constructed of a double-sided board on the top surface of which a signal line pattern 31 composing a microstripline-type transmission line is formed and on the bottom surface of which the ground pattern of a microstripline-type transmission line (hereinafter, referred to as 'ground pattern') 32 is formed, and in the vicinity of the one end side of the transfer board (in the vicinity of the end portion of the board that is opposite to the connector-mounting hole 2), a via hole 33 that electrically connects the top surface layer of the board and the ground pattern 32 is provided. Here, the core wire 11 of the coaxial connector 10 inserted in the connector-mounting hole 2, as mentioned above, extends to the upper portion of the signal line pattern 31 of the transfer board 30 mounted on the inner wall of the casing 1, and is electrically connected to the signal line pattern 31 with a brazing material such as solder.

Further, the multilayer board 20 is mounted on the inner wall of the casing 1 so as to be adjacent to the transfer board 30 on the side of the wall that is opposite to the connector-mounting hole 2. The multilayer board 20 has a signal line pattern 21 constituting a microstripline-type transmission line located on the top surface thereof, the ground pattern 22 of the microstripline transmission line located on the board-internal layer (hereinafter, referred to as 'board-internal-layer ground pattern'), and a board-bottom-surface ground pattern 23; and further, the multilayer board has a via hole 24 that electrically interconnects these patterns 22, 23 and the top surface of the board at one place near the transfer board 30.

Furthermore, on the top surfaces on the neighboring sides of the multilayer board 20 and the transfer board 30, the signal line patterns 21 and 31 of both the boards are electrically connected each other by means of ribbon bonding or the like. Similarly, the via holes 24 and 33 are mutually electrically connected by means of ribbon bonding or the like. In such a way, a transmission line is formed such that the signal line pattern 31 of the transfer board 30 and the signal line pattern 21 located on the top surface of the multilayer board 20, and the ground patterns 22, 23, and 32 are electrically connected by coplanar-type transmission lines 40, 40a. Briefly, this transmission line constructs a high-frequency transmission line that is continuous by extending across the transfer board 30 and the multilayer board 20.

The operation will now be described as below.

A high frequency signal input from the coaxial connector 10 passes the connecting portion between the core wire 11 of the coaxial connector 10 and the signal line pattern 31 of the transfer board 30, propagates through the microstripline-type transmission line 31 constructed of the above-described signal line pattern, then passes the coplanar-type transmission line 40, and subsequently propagates through the microstripline-type transmission line 21 constructed of the signal line pattern formed on the multilayer board 20. Also in the case of the propagating line in the opposite direction thereto, the high frequency signal, which has propagated through the microstripline-type transmission line constructed of the signal line pattern 21 formed on the top surface of the multilayer board 20, passes the coplanar-type transmission line 40, then propagates through the microstripline-type transmission line constructed of the signal line pattern 31 formed on the transfer board 30, passes the connection between the core wire 11 of the coaxial connector 10 and the signal line pattern 31 formed on the transfer board 30, and propagates to the coaxial connector 10.

According to the first embodiment described above, it is arranged as follows: the transfer board 30 is disposed between the multilayer board 20 mounted in the electroconductive casing 1 and the coaxial connector 10; the signal line pattern 31 formed on the transfer board 30 and the core wire 11 of the coaxial connector 10 are electrically connected; and further, the signal line pattern 31 formed on the transfer board 30 and the signal line pattern 21 formed on the tope surface of the multilayer board 20 are electrically connected by the coplanar-type transmission line 40. As a result, there is an effect that the disorder of impedance can be greatly reduced, and an excellent return-loss characteristic can be ensured over a broad band.

In other words, according to the above first embodiment, the disorder of impedance may be caused in the electrical connection between the coaxial connector 10 and the transfer board 30; however, in contrast to the circuit on the multilayer board 20, a control system circuit does not need to be mounted on the transfer board 30. This enables the transfer board 30 to have an optimum board structure and design. Therefore, the thickness of the transfer board 30 can be extremely reduced. This can place the signal line pattern 31 formed on the top surface of the transfer board 30 much closer to the ground pattern 32 formed on the bottom surface thereof, and can also place the grounding face formed on the casing much closer to the core wire 11 of the coaxial connector in comparison with the structure in which the multilayer board 20 is electrically directly connected to the coaxial connector 10. Consequently, there is an effect that in this area the disorder of impedance of the transmission line is greatly improved.

In addition, in the multilayer board 20, it is difficult to form the inner-layer ground pattern 22 of the microstripline-type transmission line to be close to the end face of the board, where the ground pattern 22 is constructed of the signal line pattern 21 formed on the uppermost layer thereof and the inner-layer ground pattern 22 located immediately under the line pattern 21. For this reason, there exists a pattern margin M1 (see FIG. 1 and FIG. 2) between the end face of the inner-layer ground pattern 22 and the end face of the board. However, the transfer board 30 is constructed of a single-layered, double-sided board, not a multilayer board. Therefore, the employment of, for example, an alumina substrate as the transfer board 30 enables the great reduction of the pattern margin M2 between the end face of the ground pattern 32 formed on the bottom surface of the substrate and the end face to the substrate. Briefly, in the transfer board 30, it is possible to form the ground pattern 32 located on the bottom surface thereof closely to the end face of the board. For this reason, there is an effect that the disorder of impedance of the transmission line in the vicinity of the end face of the board caused in the multilayer board 20 can be greatly reduced. As a result, there is an effect that an excellent return-loss characteristic over a broad band can be obtained by the above-described connection or joining between the coaxial connector 10 and the transfer board 30.

In contrast, if it is arranged that the signal line patterns 21, 31 forming the microstripline-type transmission line that is common to the surfaces of the multilayer board 20 and of the transfer board 30 are connected to each other, so that the two boards 20, 30 may be connected to each other, the pattern margin M1 of the internal layer of the multilayer board 20, the thickness of the multilayer board 20, and the thickness of the wall of the board gap become large. In this case, the impedance is greatly disordered in the connected portion between both the boards 20 and 30, and the excellent return-loss characteristic cannot be obtained.

However, according to the above first embodiment, the signal line pattern 31 formed on the transfer board 30 and the signal line pattern 21 formed on the top surface of the multilayer board 20 are connected by the coplanar-type transmission line 40 formed by means of ribbon bonding or the like. Thereby, the electromagnetic field in the connection propagates through the coplanar-type transmission line 40 to be concentrated on the transmission line only, thereby greatly reducing the distribution of the electromagnetic field in an inward direction of the board. Therefore, the influence of the disorder of impedance is hardly received, which may be caused by the transmission line in the vicinity of the end face of the multilayer board 20, depending on the presence or absence of the internal-layer ground pattern 22 of the board multilayer 20, the thickness of the wall of the board gap, and the thickness of the multilayer board 20. For this reason, there is an effect that a favorable return-loss characteristic can be obtained over a broad band in the electrical connection between the above-described transfer board 30 and the multilayer board 20 as well. As a result, there is an effect that a favorable return-loss characteristic can be obtained over a broad band in the entire transmission line extending from the coaxial connector 10 to the transfer board 30 and the multilayer board 20 as well.

Embodiment 2

Figure 3:
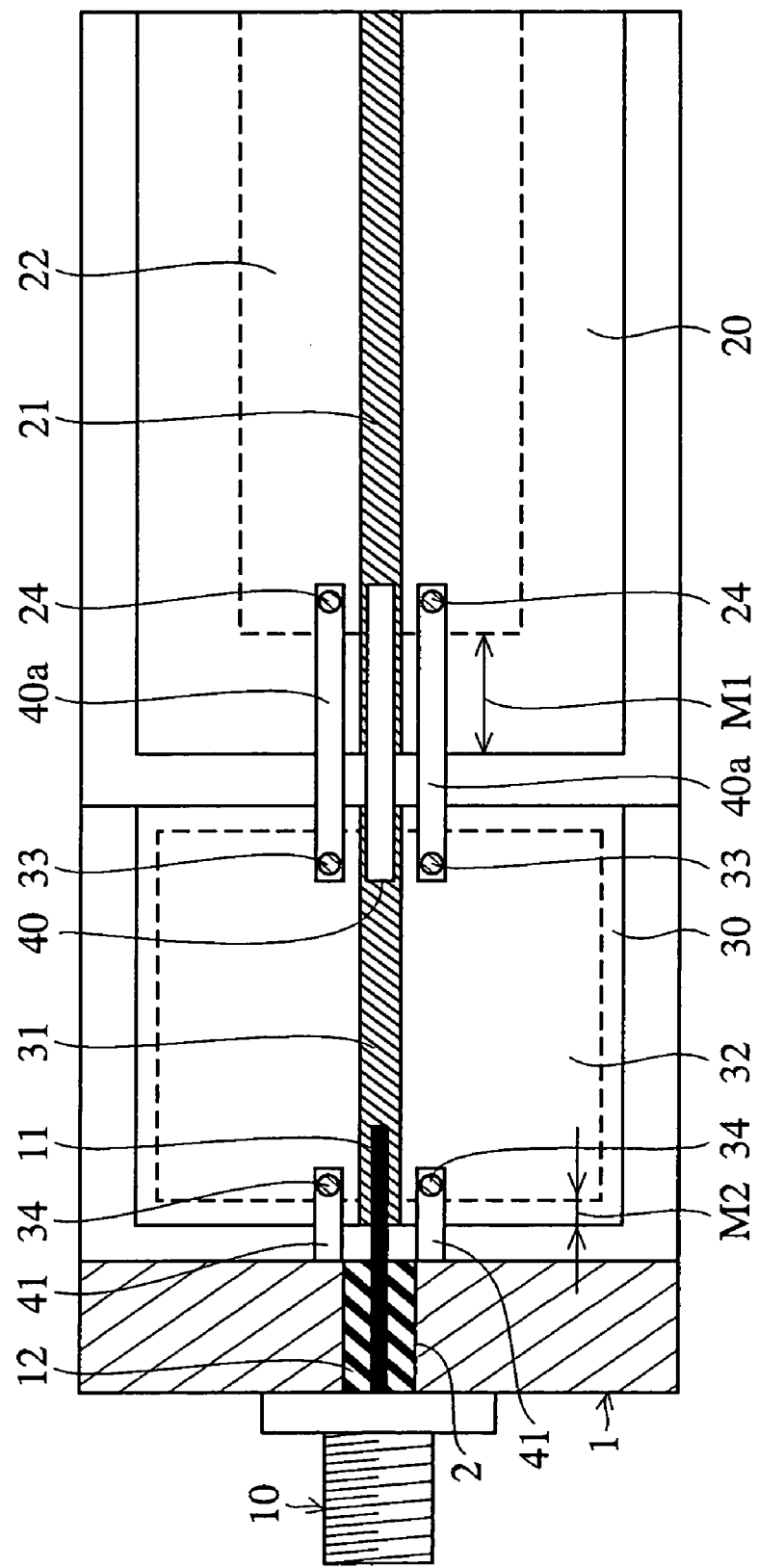
FIG. 3 is a partially cutout plan view of a connection structure between a coaxial connector and a multilayer board in accordance with a second embodiment of the present invention.

FIG. 3 is a partially cutout plan view of a connection structure between a coaxial connector and a multilayer board according to a second embodiment of the present invention. The same or equivalent parts as the ones in FIG. 1 and FIG. 2 are designated by similar numerals to omit the repetitive explanation.

In the second embodiment, in the connection structure between the coaxial connector and the multilayer board according to the above first embodiment, it is arranged such that also in the vicinity of the end face of the transfer board 30 on the side of the coaxial connector 10, two coaxial-connector-to-transfer-board via holes 34 are provided, thereby electrically connecting the via holes 34 and the electroconductive casing 1 by use of two transfer-board-connecting lines 41 formed by means of ribbon bonding or the like.

According to the second embodiment of such a structure, a coplanar-type transmission line is constructed by using the two coaxial-connector-to-transfer-board connecting lines 41, which are electrically connected from the two coaxial-connector-to-transfer-board via holes 34 to the electroconductive casing 1, and the core wire 11 of the coaxial connectors 10. As a result, the disorder of impedance can be suppressed still more effectively as compared to the case that performs the electrical connection between the coaxial connector 10 and the transfer board 30 by only the core wire 11 of the coaxial connector 10. Therefore, there is an effect that the return-loss characteristic can be further improved as compared to the case in the above-mentioned first embodiment.

Embodiment 3

Figure 4:
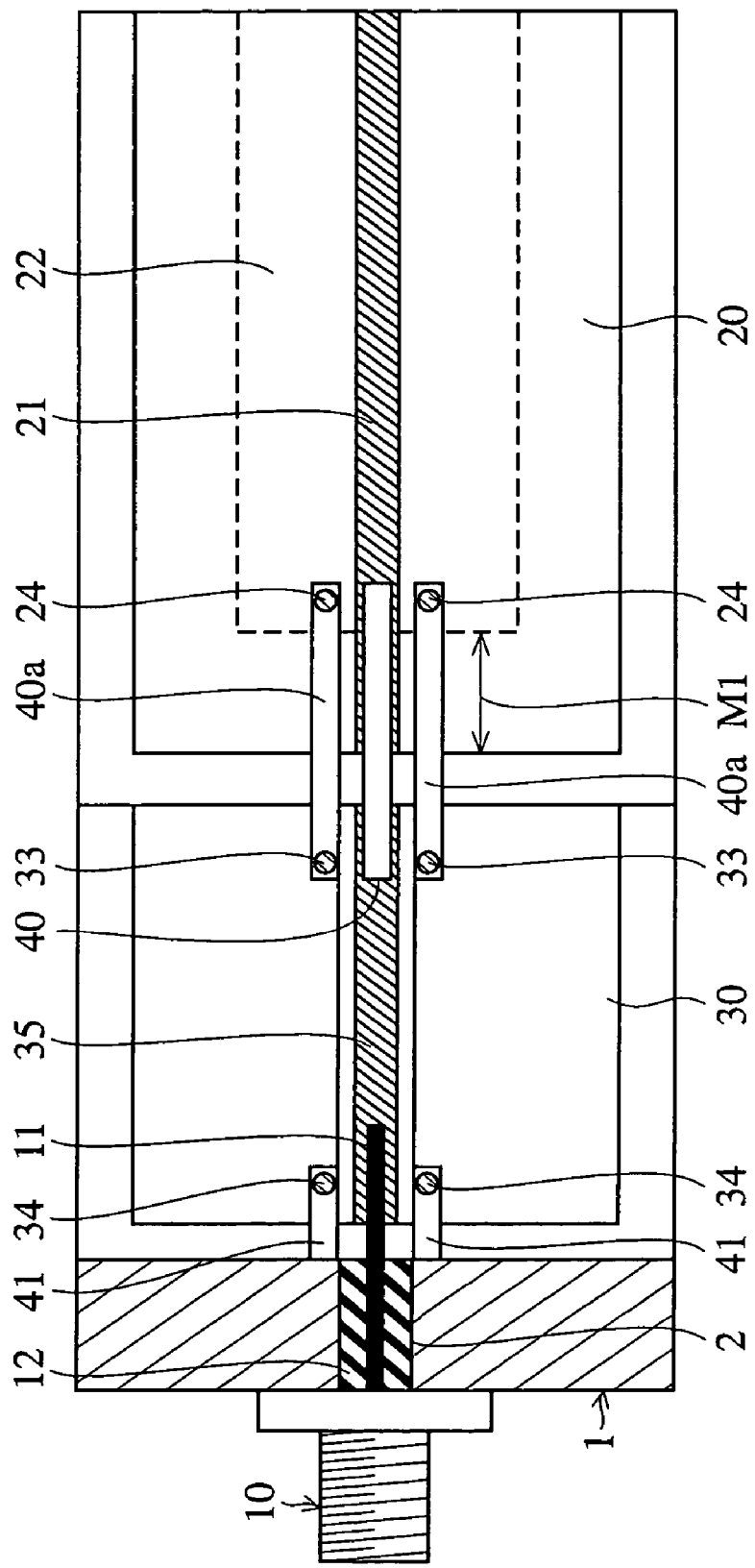
FIG. 4 is a partially cutout plan view of a connection structure between a coaxial connector and a multilayer board in accordance with a third embodiment of the present invention.

FIG. 4 is a partially cutout plan view of a connection structure between a coaxial connector and a multilayer board according to a third embodiment of the present invention. The same parts as the ones in FIG. 3 are designated by similar numerals to omit the repetitive explanation.

In the third embodiment, in the connection structure between the coaxial connector and the multilayer board according to the second embodiment, it is arranged that a coplanar-type transmission line 35 is formed on the top surface of the transfer board 30 instead of the microstripline.

Thus, according to the above third embodiment, the connection structure is arranged so that the top surface of the transfer board 30 is provided with the coplanar-type transmission line 35. Accordingly, the coplanar-type transmission line is constructed of two coaxial-connector-to-transfer-board connecting lines 41, which are connected from the coaxial-connector-to-transfer-board via holes 34 to the electroconductive casing 1, and the core wire 11 of the coaxial connector 10. Thereby, when the electromagnetic wave is propagated from this coplanar-type transmission line to the transfer board 30, and also when the electromagnetic wave is propagated in the opposite direction thereof, in either case, the propagation thereof can be always performed while keeping up the electromagnetic-field-transmission mode of the coplanar type. For this reason, there is an effect that the deterioration of the return-loss characteristic can be suppressed more effectively as compared to the case in the formation of the microstripline-type transmission line on the top surface of the transfer board 30, which needs the conversion of the electromagnetic-field-transmission mode between the microstripline type and the coplanar type. Similarly, when the electromagnetic wave is propagated from the transfer board 30 to the coplanar-type transmission line 40, or also when the electromagnetic wave is propagated in the opposite direction, the propagation thereof can be always performed while keeping up the electromagnetic-field-transmission mode of the coplanar type. Accordingly, there is an effect that the deterioration of the return-loss characteristic can be suppressed more positively as compared to the case on the formation of only the microstripline-type transmission line on the top surface of the transfer board 30, which needs the conversion of the electromagnetic-field-transmission mode between the microstripline type and the coplanar type. Consequently, there is an effect that the return-loss characteristic can be improved more effectively in the third embodiment than in the above-mentioned second embodiment.

Embodiment 4

Figure 5:
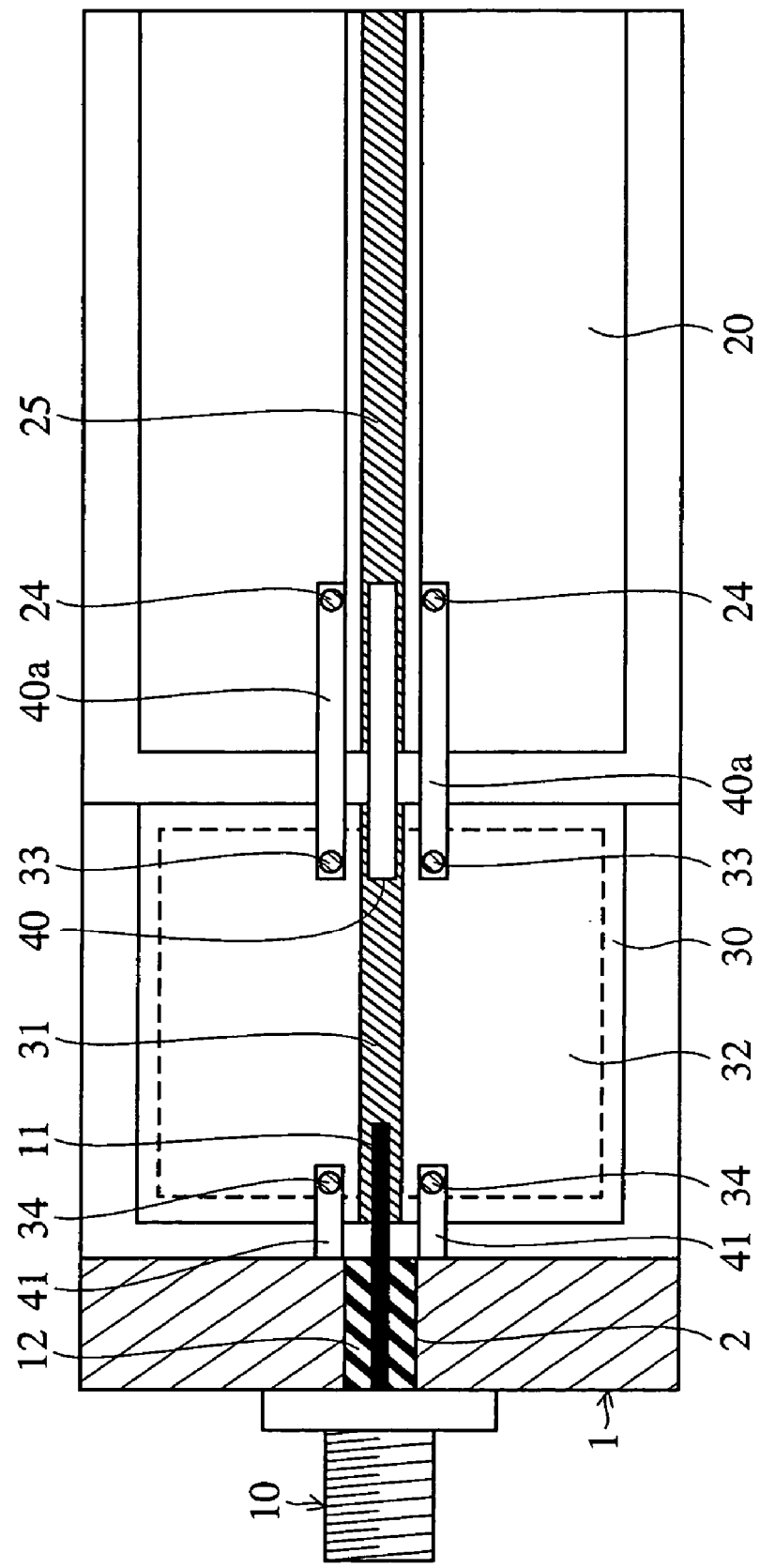
FIG. 5 is a partially cutout plan view of a connection structure between a coaxial connector and a multilayer board, in accordance with a fourth embodiment of the present invention.

FIG. 5 is a partially cutout plan view of a connection structure between a coaxial connector and a multilayer board according to a fourth embodiment of the present invention. The same parts as the ones in FIG. 3 are designated by similar numerals to omit the repetitive explanation.

In the above third embodiment, the coplanar-type transmission line 35 is substituted for the microstripline-type transmission line 31 used on the transfer board 30 in the above second embodiment; however, in the fourth embodiment, a coplanar-type transmission line 25 is substituted for the microstripline-type transmission line 21 used on the multilayer board 20 in the above second embodiment.

According to the fourth embodiment, it is arranged that the coplanar-type transmission line 25 replacing the microstripline-type transmission line 21 according to the above second embodiment be provided on the top surface of the multilayer board 20. Thus, when the electromagnetic wave is propagated from the multilayer board 20 to the coplanar-type transmission line 25, and also when the electromagnetic wave is propagated in the opposite direction, in either case, the propagation thereof can be always performed while keeping up the electromagnetic field transmission mode of the coplanar type. Accordingly, there is an effect that the deterioration of the return-loss characteristic can be suppressed more effectively as compared to the case on the formation of the microstripline-type transmission line on the top surface of the multilayer board 20, which needs the conversion of the electromagnetic-field-transmission mode between the microstripline type and the coplanar type. Therefore, there is an effect that the return-loss characteristic can be improved more effectively in the fourth embodiment than in the above-mentioned second embodiment.

Embodiment 5

Figure 6:
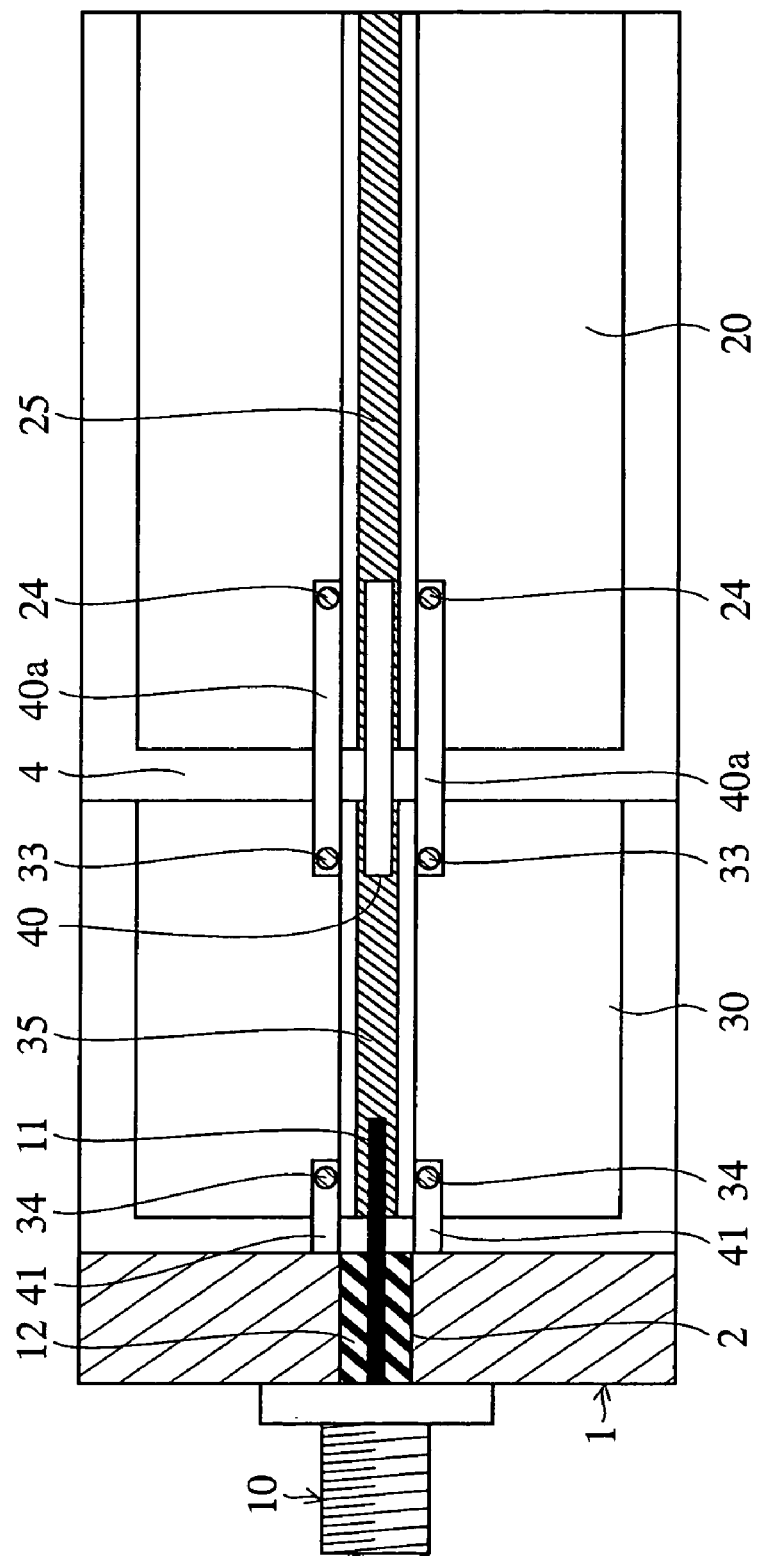
FIG. 6 is a partially cutout plan view of a connection structure between a coaxial connector and a multilayer board in accordance with a fifth embodiment of the present invention.

FIG. 6 is a partially cutout plan view of a connection structure between a coaxial connector and a multilayer board according to a fifth embodiment of the present invention. The same parts as the ones in FIG. 3 are designated by similar numerals to omit the repetitive explanation.

In the fifth embodiment, it is arranged that coplanar-type transmission lines 35 and 25 replacing the microstripline-type transmission lines 31 and 21 according to the above second embodiment are formed on both the top surfaces of the transfer board 30 and the multilayer board 20.

According to the fifth embodiment in which the coplanar-type transmission lines 35 and 25 are thus formed on both the top surfaces of the transfer board 30 and the multilayer board 20, when the electromagnetic wave is propagated from the coplanar-type transmission line, which is constructed of the two electroconductive-casing-to-transfer-board connecting lines 41 connected from the coaxial-connector-to-transfer-board via holes 34 to the electroconductive casing 1 and the core wire 11 of the coaxial connector 10, to the transfer board 30, and also when the electromagnetic wave is propagated in the opposite direction, in either case, the propagation thereof can be always performed while keeping up the electromagnetic field transmission mode of the coplanar type. For this reason, there is an effect that the deterioration of the return-loss characteristic can be suppressed more positively as compared to the case that is formed with the microstripline-type transmission line on the top surface of the transfer board 30 such that the conversion of the electromagnetic-field-transmission mode between the microstripline type and the coplanar type is necessary.

Further, when the electromagnetic wave is propagated from the transfer board 30 to the coplanar-type transmission line 40, and also when the electromagnetic wave is propagated in the opposite direction, in either case, the propagation thereof can be always performed while keeping up the electromagnetic-field-transmission mode of the coplanar type. For this reason, there is an effect that the deterioration in the return loss characteristic can be suppressed more positively as compared to the case that is formed with the microstripline-type transmission line. Furthermore, when the electromagnetic wave is propagated from the multilayer board 20 to the coplanar-type transmission line 40, and also when the electromagnetic wave is propagated in the opposite direction, in either case, the propagation thereof can be always performed while keeping up the electromagnetic-field-transmission mode of the coplanar type. Consequently, there is an effect that the deterioration of the return-loss characteristic can be suppressed more effectively as compared to the case formed with the microstripline-type transmission line on the top surface of the multilayer board 20 such that the conversion of the electromagnetic-field-transmission mode between the microstripline type and the coplanar type is necessary. Therefore, there is an effect that the return-loss characteristic can be improved more positively in the fifth embodiment than in the above-mentioned second embodiment 2.

INDUSTRIAL APPLICABILITY

As mentioned above, a connection structure between a coaxial connector and a multilayer board according to the present invention can be used for a high-frequency circuits and so on of communication apparatuses.

The invention claimed is:

1. A connection structure between a coaxial connector and a multilayer board comprising:
   a casing;
   a coaxial connector provided in this casing, and including a core wire;
   a multilayer board provided in the casing, and including a first signal line pattern, an inner-layer pattern, and a pattern margin provided between an end face of the inner-layer pattern and an end face of the multilayer board;
   a transfer board provided in the casing located between the multilayer board and the coaxial connector, the transfer board including a second signal line pattern, a ground pattern, and a pattern margin provided between an end face of the ground pattern and an end face of the transfer board, and the transfer board formed so that the thickness of the transfer board is smaller than the thickness of the multilayer board;
   connecting means for electrically connecting the core wire of the coaxial connector and the second signal line pattern; and
   a transmission line that electrically connects the first signal line pattern to the second signal line pattern, and suppresses an electromagnetic field distribution in an inward direction of the multilayer board;
   wherein the pattern margin of the transfer board is smaller than the pattern margin of the multilayer board.

2. A connection structure between a coaxial connector and a multilayer board according to claim 1, wherein the transmission line is a coplanar-type transmission line.

3. A connection structure between a coaxial connector and a multilayer board according to claim 1, wherein the multilayer board that has the first signal line pattern includes a microstripline-type transmission line or a coplanar-type transmission line.

4. A connection structure between a coaxial connector and a multilayer board according to claim 1, wherein the transfer board includes a top surface layer electrically connected by a via to the ground pattern of the transfer board.

5. A connection structure between a coaxial connector and a multilayer board comprising:
   a casing formed of an upper floor, a lower floor, and a sidewall adjacent to the upper floor;
   a coaxial connector provided on the sidewall, and including a core wire;
   a multilayer board provided on the lower floor, and including a first signal line pattern, an inner-layer pattern, and a pattern margin provided between an end face of the inner-layer pattern and an end face of the multilayer board;
   a transfer board provided on the upper floor, and including a second signal line patterns a ground pattern, and a pattern margin provided between an end face of the ground pattern and an end face of the transfer board;
   connecting means for electrically connecting the core wire of the coaxial connector and the second signal line pattern; and
   a transmission line that electrically connects the first signal line pattern to the second signal line pattern, and suppresses an electromagnetic field distribution in an inward direction of the multilayer board;
   wherein the pattern margin of the transfer board is smaller than the pattern margin of the multilayer board.

6. A connection structure between a coaxial connector and a multilayer board according to claim 5, wherein the transmission line is a coplanar-type transmission line.

7. A connection structure between a coaxial connector and a multilayer board according to claim 5, wherein the multilayer board that has the first signal line pattern includes a microstripline-type transmission line or a coplanar-type transmission line.

8. A connection structure between a coaxial connector and a multilayer board according to claim 5, wherein the transfer board includes a top surface layer electrically connected by a via to the ground pattern of the transfer board.

* * * * *